(12) United States Patent
Russell

(10) Patent No.: US 8,884,372 B2
(45) Date of Patent: Nov. 11, 2014

(54) ANALOG SIGNAL COMPATIBLE CMOS SWITCH AS AN INTEGRATED PERIPHERAL TO A STANDARD MICROCONTROLLER

(75) Inventor: James K. Russell, Eden Prairie, MN (US)

(73) Assignee: Microchip Technology Incorporated, Chandler, AZ (US)

( * ) Notice: Subject to any disclaimer, the term of this patent is extended or adjusted under 35 U.S.C. 154(b) by 298 days.

(21) Appl. No.: 13/352,616

(22) Filed: Jan. 18, 2012

(65) Prior Publication Data
US 2013/0181295 A1 Jul. 18, 2013

(51) Int. Cl.
*H01L 21/70* (2006.01)

(52) U.S. Cl.
USPC ..... 257/369; 257/371; 257/373; 257/E27.062

(58) Field of Classification Search
None
See application file for complete search history.

(56) References Cited

U.S. PATENT DOCUMENTS

| | | | | |
|---|---|---|---|---|
| 5,376,829 | A | 12/1994 | Rogers et al. | 327/408 |
| 6,605,032 | B2 * | 8/2003 | Benkowski et al. | 600/16 |
| 6,975,145 | B1 | 12/2005 | Vadi et al. | 327/99 |
| 2007/0159184 | A1 * | 7/2007 | Reynolds et al. | 324/662 |
| 2010/0201428 | A1 | 8/2010 | Chu | 327/408 |
| 2012/0274385 | A1 * | 11/2012 | Curatolo | 327/427 |

FOREIGN PATENT DOCUMENTS

WO 2007/122281 A1 11/2007 ............ H02M 1/096

OTHER PUBLICATIONS

Goodenough, Frank, "Microcontroller Switches 5-A, 60-V Current Pulses," Electronic Design, Penton Media, vol. 41, No. 21, 5 pages.
Mahgoub, Osama A., "Microcontroller-Based Switch for Three-Phase Transformer Inrush Current Minimization," Power Electronics Congress, Technical Proceedings, 6 pages.
Ali, Sam et al., "Design & Implementation of a 3-phase Energy Efficient Switchable Transformer Controller Using the PIC18F8720 Microcontroller," International Conference on Power System Technology—POWERCON, 6 pages.
International Search Report and Written Opinion, Application No. PCT/US2013/021840, 10 pages.

* cited by examiner

*Primary Examiner* — Yasser A Abdelaziez
(74) *Attorney, Agent, or Firm* — King & Spalding L.L.P.

(57) ABSTRACT

At least one analog signal compatible complementary metal oxide semiconductor (CMOS) switch circuit is incorporated with digital logic circuits in an integrated circuit. The integrated circuit may further comprise a digital processor and memory, e.g., microcontroller, microprocessor, digital signal processor (DSP), programmable logic array (PLA), application specific integrated circuit (ASIC), etc., for controlling operation of the at least one analog signal compatible CMOS switch for switching analog signals, e.g., audio, video, serial communications, etc. The at least one analog signal compatible CMOS switch may have first and second states, e.g., single throw "on" or "off", or double throw common to a or b, controlled by a single digital control signal of either a logic "0" or a logic "1".

18 Claims, 5 Drawing Sheets

ANALOG SIGNAL COMPATIBLE CMOS SWITCH AS AN INTEGRATED PERIPHERAL TO A STANDARD MICROCONTROLLER

TECHNICAL FIELD

The present disclosure relates to integrated circuit microcontrollers, and more particularly, to an integrated circuit microcontroller having at least one analog signal compatible CMOS switch controllable as an integrated peripheral thereto.

BACKGROUND

Analog switching functions are required in modern day electronic devices. When an analog switching function is required in the electronic device, discrete components may be used to perform such analog functions and they are controlled by digital logic level signals from a digital circuit, e.g., digital processor in the electronic device. Or a mixed signal (analog and digital circuits) integrated circuit is used wherein the analog input signal is converted into a digital format, processed by the digital portion of the mixed signal integrated circuit and then converted back into an analog output signal. The former requires a number of discrete components and increased size of a printed circuit board. The latter requires a complex and expensive mixed signal integrated circuit, fast computing capabilities and has a high power demand.

SUMMARY

Therefore, a need exists for an integrated circuit device that can switch and control external analog signals, and be in a small size package that is low in cost and power consumption.

According to an embodiment, an integrated circuit device may comprise: a digital processor; a memory coupled to the digital processor; and at least one analog signal compatible single pole single throw complementary metal oxide semiconductor (CMOS) switch coupled to and controlled by the digital processor, wherein the at least one analog signal compatible single pole single throw CMOS switch has a low impedance between a first node and a second node when the digital processor asserts a control signal at a first logic level thereto, and a high impedance between the first node and the second node when the digital processor asserts the control signal at a second logic level thereto.

According to a further embodiment, the first logic level is a logic level high and the second logic level is a logic level low. According to a further embodiment, the first logic level is a logic level low and the second logic level is a logic level high. According to a further embodiment, the at least one analog signal compatible single pole single throw CMOS switch is a plurality of analog signal compatible single pole single throw CMOS switches.

According to a further embodiment, the at least one analog signal compatible single pole single throw CMOS switch may comprise: a P-channel metal oxide semiconductor (P-MOS) transistor having a source, gate and drain; an N-channel metal oxide semiconductor (N-MOS) transistor having a source, gate and drain; and an inverter; wherein: the drain of the P-MOS transistor is coupled to the source of the N-MOS transistor and the first node, the source of the P-MOS transistor is coupled to the drain of the N-MOS transistor and the second node, the gate of the P-MOS transistor and an input of the inverter are coupled to a digital control output of the digital processor, and the gate of the N-MOS transistor is coupled to an output of the inverter.

According to a further embodiment, the digital processor is a microcontroller. According to a further embodiment, the digital processor is selected from the group consisting of a microprocessor, a digital signal processor (DSP), a programmable logic array (PLA), and an application specific integrated circuit (ASIC). According to a further embodiment, an integrated circuit package encloses the integrated circuit device, wherein the first and second nodes are connections on the integrated circuit package.

According to another embodiment, an integrated circuit device may comprise: a digital processor; a memory coupled to the digital processor; and at least one analog signal compatible single pole double throw complementary metal oxide semiconductor (CMOS) switch coupled to and controlled by the digital processor, wherein the at least one analog signal compatible single pole double throw CMOS switch has a low impedance between a first node and a second node and a high impedance between the first node and a third node when the digital processor asserts a control signal at a first logic level thereto, and a high impedance between the first node and the second node and a low impedance between the first node and the third node when the digital processor asserts a control signal at a second logic level thereto.

According to a further embodiment, the first logic level is a logic level high and the second logic level is a logic level low. According to a further embodiment, the first logic level is a logic level low and the second logic level is a logic level high. According to a further embodiment, the at least one analog signal compatible single pole double throw CMOS switch is a plurality of analog signal compatible single pole double throw CMOS switches.

According to a further embodiment, the single pole double throw CMOS switch may comprise: a first P-channel metal oxide semiconductor (P-MOS) transistor having a source, gate and drain; a second P-channel metal oxide semiconductor (P-MOS) transistor having a source, gate and drain; a first N-channel metal oxide semiconductor (N-MOS) transistor having a source, gate and drain; a second N-channel metal oxide semiconductor (N-MOS) transistor having a source, gate and drain; a first inverter; and a second inverter; wherein: the drain of the first P-MOS transistor is coupled to the source of the first N-MOS transistor and the first node, the source of the first P-MOS transistor is coupled to the drain of the first N-MOS transistor and the second node, the gate of the first P-MOS transistor and an input of the first inverter are coupled to a digital control output of the digital processor, the gate of the first N-MOS transistor is coupled to an output of the first inverter, the drain of the second P-MOS transistor is coupled to the source of the second N-MOS transistor and the first node, the source of the second P-MOS transistor is coupled to the drain of the second N-MOS transistor and the third node, the gate of the second N-MOS transistor and an input of the second inverter are coupled to the digital control output of the digital processor, and the gate of the second P-MOS transistor is coupled to an output of the second inverter.

According to a further embodiment, the digital processor is a microcontroller. According to a further embodiment, the digital processor is selected from the group consisting of a microprocessor, a digital signal processor (DSP), a programmable logic array (PLA), and an application specific integrated circuit (ASIC). According to a further embodiment, an integrated circuit package encloses the integrated circuit device, wherein the first, second and third nodes are connections on the integrated circuit package.

According to yet another embodiment, an integrated circuit device may comprise: a digital processor; a memory coupled to the digital processor; and at least one analog signal compatible single pole complementary metal oxide semiconductor (CMOS) switch coupled to and controlled by the digital processor, wherein the at least one analog signal compatible single pole CMOS switch has a high impedance between a first node and a second node and a low impedance between the first node and a third node when the digital processor asserts control signals at first logic levels thereto, a high impedance between the first node and the second node and a high impedance between the first node and the third node when the digital processor asserts control signals at second logic levels thereto, a low impedance between the first node and the second node and a low impedance between the first node and the third node when the digital processor asserts control signals at third logic levels thereto, and a low impedance between the first node and the second node and a high impedance between the first node and the third node when the digital processor asserts control signals at fourth logic levels thereto.

According to a further embodiment, the first logic levels are binary 00, the second logic levels are binary 01, the third logic levels are binary 10, and the fourth logic levels are binary 11. According to a further embodiment, the at least one analog signal compatible single pole CMOS switch is a plurality of analog signal compatible single pole CMOS switches.

According to a further embodiment, the single pole CMOS switch may comprise: a first P-channel metal oxide semiconductor (P-MOS) transistor having a source, gate and drain; a second P-channel metal oxide semiconductor (P-MOS) transistor having a source, gate and drain; a first N-channel metal oxide semiconductor (N-MOS) transistor having a source, gate and drain; a second N-channel metal oxide semiconductor (N-MOS) transistor having a source, gate and drain; a first inverter; and a second inverter; wherein: the drain of the first P-MOS transistor is coupled to the source of the first N-MOS transistor and the first node, the source of the first P-MOS transistor is coupled to the drain of the first N-MOS transistor and the second node, the gate of the first P-MOS transistor and an input of the first inverter are coupled to a first digital control output of the digital processor, the gate of the first N-MOS transistor is coupled to an output of the first inverter, the drain of the second P-MOS transistor is coupled to the source of the second N-MOS transistor and the first node, the source of the second P-MOS transistor is coupled to the drain of the second N-MOS transistor and the third node, the gate of the second N-MOS transistor and an input of the second inverter are coupled to a second digital control output of the digital processor, and the gate of the second P-MOS transistor is coupled to an output of the second inverter.

According to a further embodiment, the digital processor is a microcontroller. According to a further embodiment, an integrated circuit package encloses the integrated circuit device, wherein the first, second and third nodes are connections on the integrated circuit package.

BRIEF DESCRIPTION OF THE DRAWINGS

A more complete understanding of the present disclosure may be acquired by referring to the following description taken in conjunction with the accompanying drawings wherein.

Figure 1:
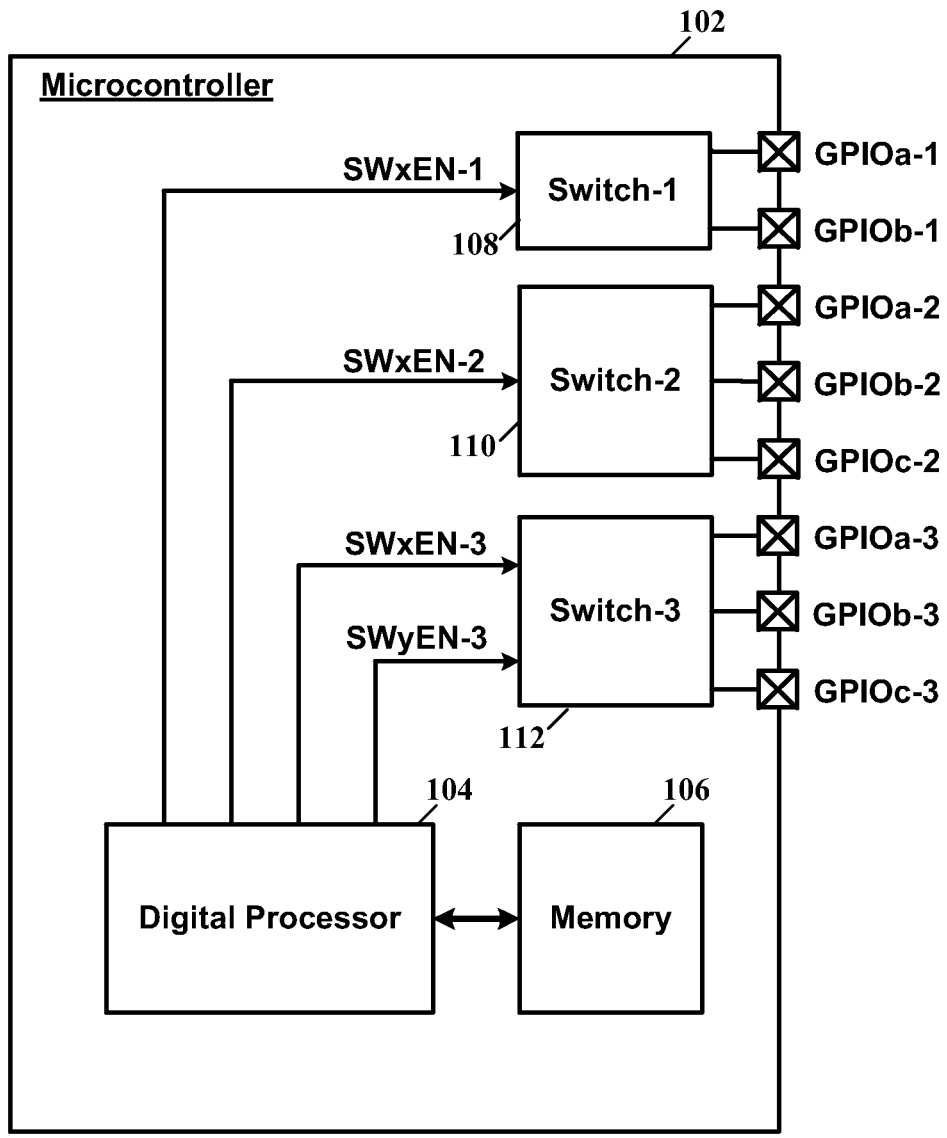
FIG. 1 is a schematic block diagram of an integrated circuit device comprising a digital processor, memory and at least one analog signal compatible CMOS switch for switching analog signals, according to the teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

At least one integrated circuit analog signal compatible complementary metal oxide semiconductor (CMOS) switch circuit is incorporated with digital logic circuits in an integrated circuit. The integrated circuit may further comprise a digital processor and memory, e.g., microcontroller, microprocessor, digital signal processor (DSP), programmable logic array (PLA), application specific integrated circuit (ASIC), etc., for controlling operation of the at least one analog signal compatible CMOS switch for switching analog signals, e.g., audio, video, serial communications, etc. The at least one analog signal compatible CMOS switch may have first and second states, e.g., single throw "on" or "off", or double throw common to a or b, controlled by a single digital control signal of either a logic "0" or a logic "1". The at least one analog signal compatible CMOS switch may also have up to four states, e.g., double throw off—no connection, and common to a or b or both, controlled by a two bit digital control signal of 00, 01, 10 or 11 logic levels. Standard low cost, minimal space and low power consumption CMOS cells may be used to implement the at least one analog signal compatible CMOS switch in the integrated circuit device. The at least one analog signal compatible CMOS switch is adapted to switch external analog signals based on logic from the digital processor. Integrated circuit package connections (e.g., pins or ball bumps) of the integrated circuit device are used to couple the at least one analog signal compatible CMOS switch to the external analog signals.

Referring now to the drawing, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of an integrated circuit device comprising a digital processor, memory and at least one analog signal compatible CMOS switch for switching analog signals, according to the teachings of this disclosure. An integrated circuit (IC) device 102 comprises a digital processor 104, a memory 106 and at least one analog signal compatible CMOS switch 108. A plurality of analog signal compatible CMOS switches, e.g., switches 110 and 112, may also be included in the IC device 102. The at least one analog signal compatible CMOS switch 108 (110 and 112) is controlled with a single bit digital logic control signal SWxEN that maintains one of two states, e.g., "off" or "on" or position a or b, of the at least one CMOS switch 108, with either a logic "0" or a logic "1" control signal SWxEN, respectively.

The digital processor 104 may be, for example but is not limited to, a microcontroller, a microprocessor, a digital signal processor (DSP), a programmable logic array (PLA), an application specific integrated circuit (ASIC) and the like. The memory 106 may be volatile and/or non-volatile memory for storing program information and/or data to run in combination with the digital processor 104. The IC device 102 may be unpackaged or packaged in an IC package of any type. External connections, GPIO, are provided for coupling to external analog signals to be switched by the at least one analog signal compatible CMOS switch 108 (110 and 112). Each analog signal compatible CMOS switch comprises at least one P-channel metal oxide semiconductor (P-MOS) transistor and at least one N-channel metal oxide semiconductor (N-MOS) transistor, thus forming a complementary metal oxide semiconductor (CMOS) switch. The at least one analog signal compatible CMOS switch is voltage polarity insensitive to an analog signal. The analog signal that is switched may be as large in voltage and/or current as the P-MOS and N-MOS transistors are capable of handling. The analog signal compatible CMOS switch 108 is a single pole, single throw switch; the analog signal compatible CMOS switch 110 is a two position, single pole, double throw switch; and the analog signal compatible CMOS switch 112 is an up to a four position, single pole, double throw switch; as described more fully hereinafter.

Figure 2:
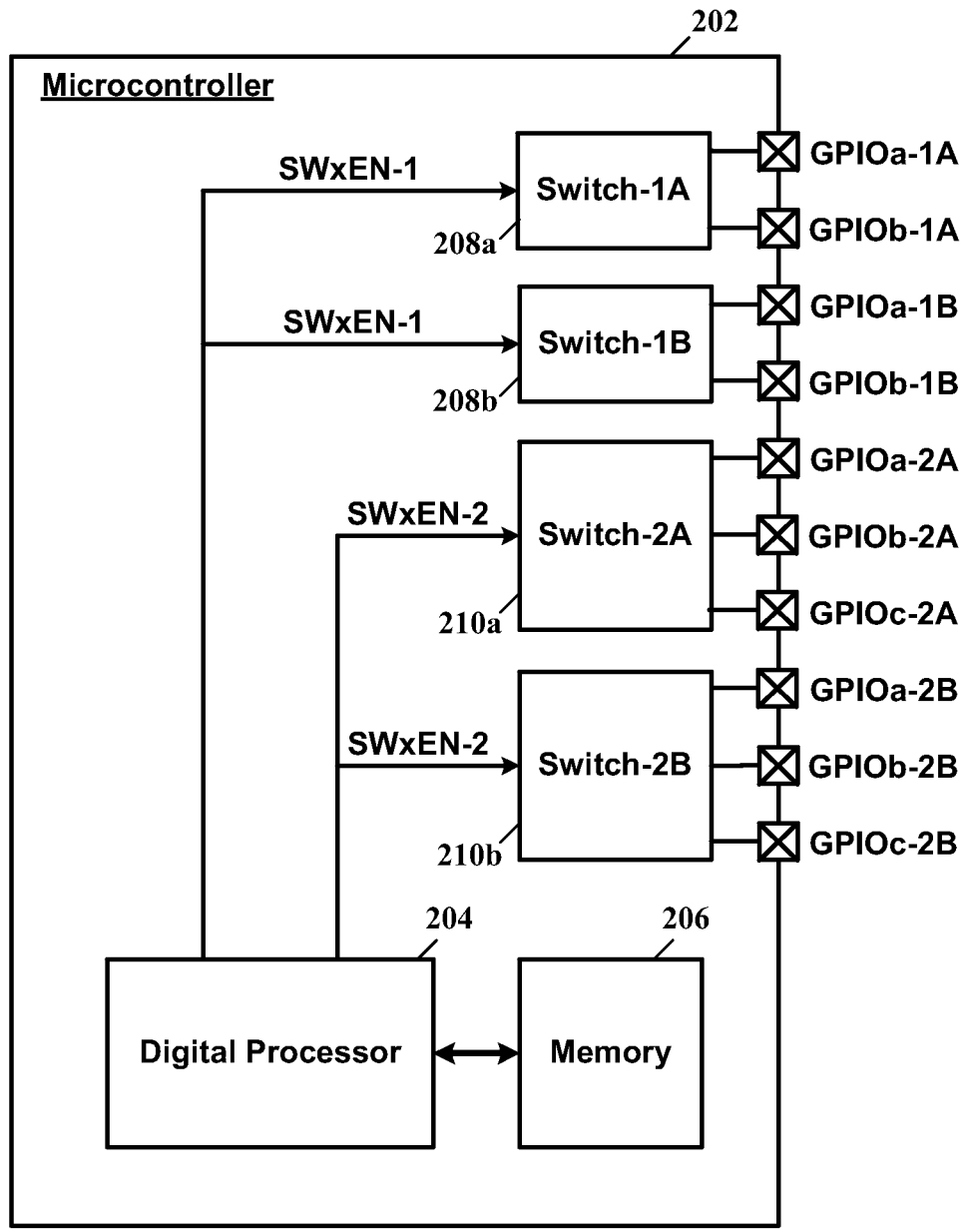
FIG. 2 is a schematic block diagram of another integrated circuit device comprising a digital processor, memory and at least one analog signal compatible CMOS switch for switching analog signals, according to the teachings of this disclosure.

Referring to FIG. 2, depicted is a schematic block diagram of another integrated circuit device comprising a digital processor, memory and an at least one analog signal compatible CMOS switch for switching analog signals, according to the teachings of this disclosure. An integrated circuit (IC) device 202 comprises a digital processor 204, a memory 206, and at least one analog signal compatible double pole CMOS switches 208. A plurality of double pole analog signal compatible CMOS switches, e.g., switches 210, may also be included in the IC device 202. The at least one analog signal compatible double pole CMOS switches 208 (and 210) is controlled with a single bit digital logic control signal SWxEN that maintains one of two states, e.g., "off" or "on" or position a or b, of the at least one analog signal compatible double pole CMOS switch 108, with either a logic "0" or a logic "1" control signal SWxEN, respectively.

The digital processor 204 may be, for example but is not limited to, a microcontroller, a microprocessor, a digital signal processor (DSP), a programmable logic array (PLA), an application specific integrated circuit (ASIC) and the like. The memory 206 may be volatile and/or non-volatile memory for storing program information and/or data to run in combination with the digital processor 204. The IC device 202 may be unpackaged or packaged in an IC package of any type. External connections, GPIO, (nodes) are provided for coupling to external analog signals to be switched by the at least one analog signal compatible CMOS switch 208 (and 210). Each analog signal compatible CMOS double pole switch comprises at least one P-channel metal oxide semiconductor (P-MOS) transistor and at least one N-channel metal oxide semiconductor (N-MOS) transistor, thus forming a complementary metal oxide semiconductor (CMOS) switch. The at least one analog signal compatible double pole CMOS switch is voltage polarity insensitive to an analog signal. The analog signals that are switched may be as large in voltage and/or current as the P-MOS and N-MOS transistors are capable of handling. The analog signal compatible double pole CMOS switch 208 is a two pole, single throw switch; and the analog signal compatible CMOS switch 210 is a two position, double pole, double throw switch; as described more fully hereinafter. It is contemplated and within the scope of this disclosure that an analog signal compatible CMOS switch having more than two poles, e.g., three, four, five, etc., may be controlled with a single digital control signal SWxEN.

Figure 3:
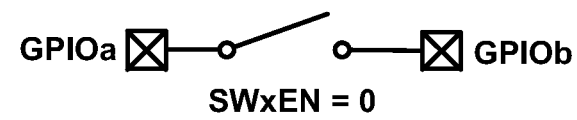
FIG. 3 is a schematic diagram of an analog signal compatible two state, single pole, single throw (SPST) CMOS switch controlled by a one bit digital control signal, according to a specific example embodiment of this disclosure.
Figure 3:
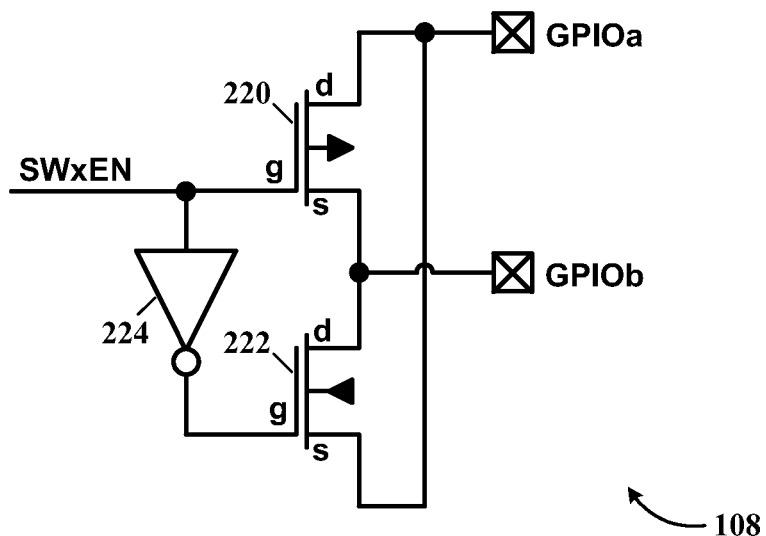

Referring to FIG. 3, depicted is a schematic diagram of an analog signal compatible two state, single pole, single throw (SPST) CMOS switch controlled by a one bit digital control signal, according to a specific example embodiment of this disclosure. The analog signal compatible CMOS switch 108 comprises a P-channel MOS (P-MOS) transistor 220, an N-channel MOS (N-MOS) transistor 222, and a digital logic inverter 224 connected as shown in FIG. 3. When the digital logic control signal, SWxEN, is at a logic "0" both of the transistors 220 and 222 are off and the signal nodes GPIOa and GPIOb have a very high impedance therebetween.

When the digital logic control signal, SWxEN, is at a logic "1" both of the transistors 220 and 222 are on and the signal nodes GPIOa and GPIOb have a low impedance therebetween. Thus the analog signal compatible CMOS switch 108 connects or disconnects an analog signal of any polarity between signal nodes GPIOa and GPIOb. The P-MOS transistor 220, the N-MOS transistor 222, and the inverter 224 are easily implemented onto a standard digital integrated circuit at low cost, and minimal space requirements. The circuit shown in FIG. 3 is the basic building block for more complex analog signal compatible CMOS switches contemplated and further discussed herein, according to the teachings of this disclosure.

Figure 4:
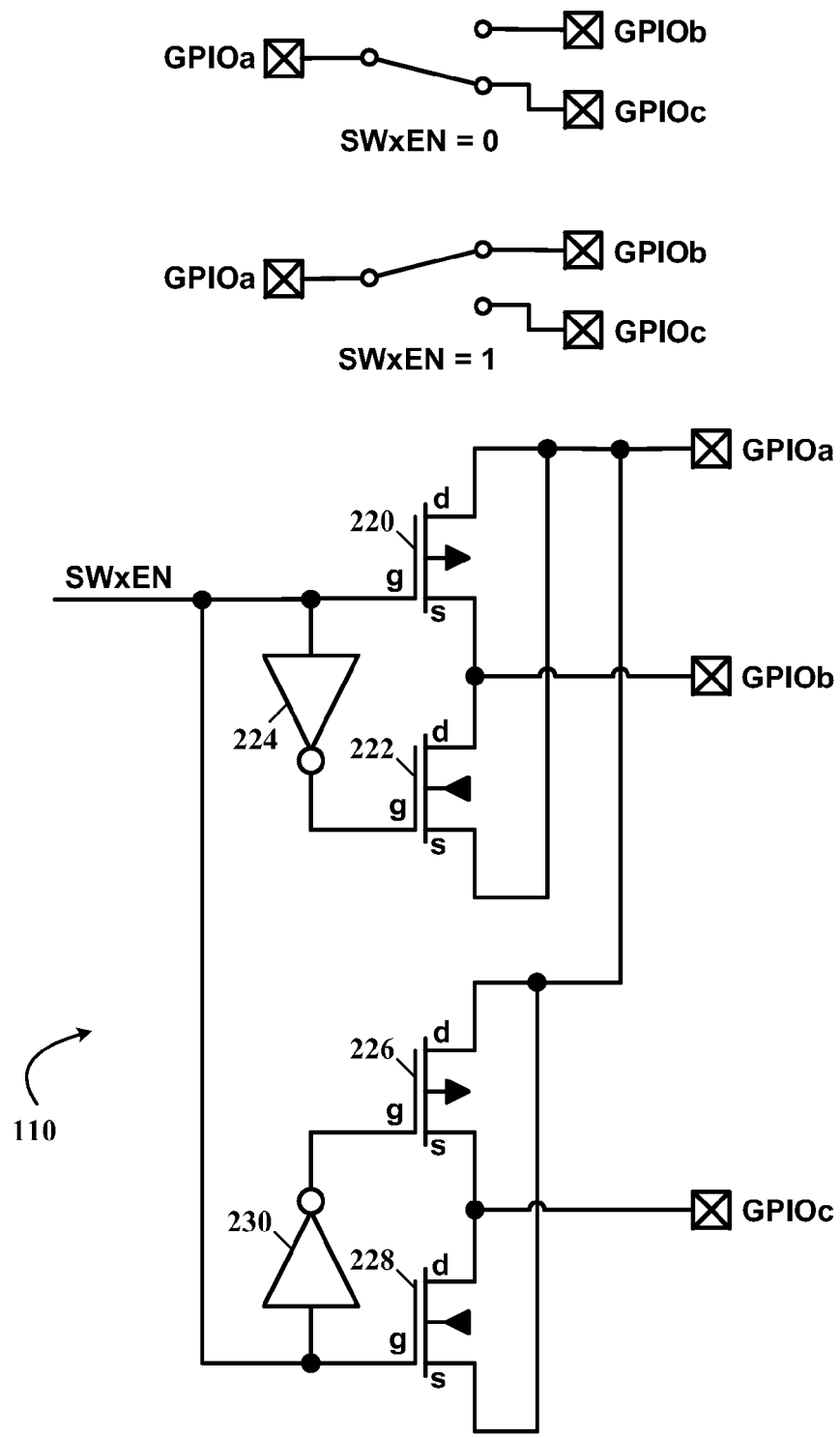
FIG. 4 is a schematic diagram of an analog signal compatible two state, single pole, double throw (SPDT) CMOS switch controlled by a one bit digital control signal, according to another specific example embodiment of this disclosure.

Referring to FIG. 4, depicted is a schematic diagram of an analog signal compatible two state, single pole, double throw (SPDT) analog signal compatible CMOS switch controlled by a one bit digital control signal, according to another specific example embodiment of this disclosure. The analog signal compatible CMOS switch 110 comprises P-channel MOS (P-MOS) transistors 220 and 226, N-channel MOS (N-MOS) transistors 222 and 228, and digital logic inverters 224 and 230 connected as shown in FIG. 4. When the digital logic control signal, SWxEN, is at a logic "0" transistors 220 and 222 are off, and transistors 226 and 228 are on. Thus there is a high impedance between the signal nodes GPIOa and GPIOb, and a low impedance between the signal nodes GPIOa and GPIOc.

When the digital logic control signal, SWxEN, is at a logic "1" transistors 220 and 222 are on and transistors 226 and 228 are off. Thus there is a high impedance between the signal nodes GPIOa and GPIOc, and a low impedance between the signal nodes GPIOa and GPIOb. Thus the CMOS switch 110 connects or disconnects an analog signal of any polarity between signal nodes GPIOa and GPIOb, or GPIOa and GPIOc (single pole, double throw—SPDT). The P-MOS transistors 220 and 226, the N-MOS transistors 222 and 228, and the inverters 224 and 230 are easily implemented onto a standard digital integrated circuit at low cost, and minimal space requirements.

Figure 5:
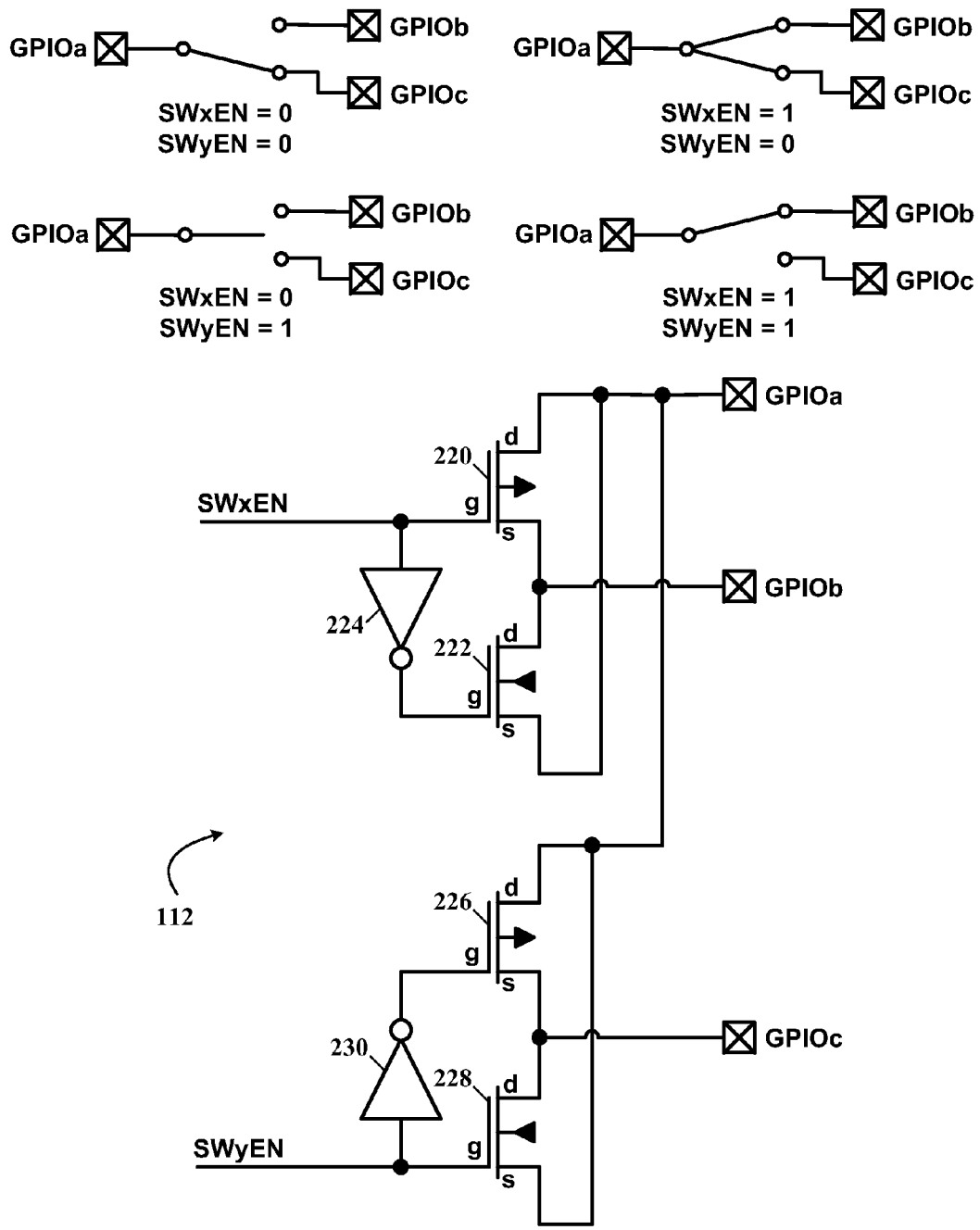
FIG. 5 is a schematic diagram of an analog signal compatible up to four state, single pole, double throw (SPDT) CMOS switch controlled by a two bit digital control signal, according to yet another specific example embodiment of this disclosure.

Referring to FIG. 5, depicted is a schematic diagram of an analog signal compatible up to four state, single pole, double throw (SPDT) analog signal compatible CMOS switch controlled by a two bit digital control signal, according to yet another specific example embodiment of this disclosure. The analog signal compatible CMOS switch 112 comprises P-channel MOS (P-MOS) transistors 220 and 226, N-channel MOS (N-MOS) transistors 222 and 228, and digital logic inverters 224 and 230 connected as shown in FIG. 4. When the first digital logic control signal, SWxEN, is at a logic "0" transistors 220 and 222 are off, and the second digital logic control signal, SWyEN, is at a logic "0" transistors 226 and 228 are on. Thus there is a high impedance between the signal nodes GPIOa and GPIOb, and a low impedance between the signal nodes GPIOa and GPIOc.

When the first digital logic control signal, SWxEN, is at a logic "0" transistors 220 and 222 are off, and the second digital logic control signal, SWyEN, is at a logic "1" transistors 226 and 228 are off. Thus there is a high impedance between the signal nodes GPIOa and GPIOb, and a high impedance between the signal nodes GPIOa and GPIOc.

When the first digital logic control signal, SWxEN, is at a logic "1" transistors 220 and 222 are on, and the second digital logic control signal, SWyEN, is at a logic "0" transistors 226 and 228 are on. Thus there is a low impedance between the signal nodes GPIOa and GPIOb, and a low impedance between the signal nodes GPIOa and GPIOc.

When the first digital logic control signal, SWxEN, is at a logic "1" transistors 220 and 222 are on, and the second digital logic control signal, SWyEN, is at a logic "1" transistors 226 and 228 are off. Thus there is a low impedance between the signal nodes GPIOa and GPIOb, and a high impedance between the signal nodes GPIOa and GPIOc.

Thus the CMOS switch 112 connects or disconnects an analog signal of any polarity between signal nodes GPIOa and GPIOb, and/or GPIOa and GPIOc. The P-MOS transistors 220 and 226, the N-MOS transistors 222 and 228, and the inverters 224 and 230 are easily fabricated onto a standard digital integrated circuit at low cost, and minimal space requirements.

It is contemplated and within the scope of this disclosure that a plurality of poles controlled by a first digital logic control signal, SWxEN, and/or second digital logic control signal, SWyEN, may be implemented with the CMOS switch circuits shown in FIGS. 3, 4 and 5 by using common control inputs and respective GPIO outputs.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit device, comprising:
   a plurality of external input/output connections;
   a microcontroller comprising:
      a digital processor;
      a memory coupled to the digital processor; and
      at least one analog signal compatible single pole single throw complementary metal oxide semiconductor (CMOS) switch coupled to and controlled by the digital processor and configured to switch signals through a first and a second external input/output connection of said plurality of input/output connections, wherein the at least one analog signal compatible single pole single throw CMOS switch comprises a first switching node coupled with the first external input/output connection of said plurality of external input/output connections and a second switching node coupled with the second external input/output connection of said plurality of external input/output connections, and wherein the at least one analog signal compatible single pole single throw CMOS switch provides
      a low impedance between the first external input/output connection and the second external input/output connection when the digital processor asserts a control signal at a first logic level thereto, and
      a high impedance between the first external input/output connection and the second external input/output connection when the digital processor asserts the control signal at a second logic level thereto.

2. The integrated circuit device according to claim 1, wherein the first logic level is a logic level high and the second logic level is a logic level low.

3. The integrated circuit device according to claim 1, wherein the first logic level is a logic level low and the second logic level is a logic level high.

4. The integrated circuit device according to claim 1, wherein the at least one analog signal compatible single pole single throw CMOS switch is a plurality of analog signal compatible single pole single throw CMOS switches.

5. The integrated circuit device according to claim 1, wherein the at least one analog signal compatible single pole single throw CMOS switch comprises:
   a P-channel metal oxide semiconductor (P-MOS) transistor having a source, gate and drain;
   an N-channel metal oxide semiconductor (N-MOS) transistor having a source, gate and drain; and
   an inverter;
   wherein:
      the drain of the P-MOS transistor is coupled to the source of the N-MOS transistor and the first switching node,
      the source of the P-MOS transistor is coupled to the drain of the N-MOS transistor and the second switching node,
      the gate of the P-MOS transistor and an input of the inverter are coupled to a digital control output of the digital processor, and
      the gate of the N-MOS transistor is coupled to an output of the inverter.

6. The integrated circuit device according to claim 1, further comprising an integrated circuit package enclosing the integrated circuit device.

7. The integrated circuit device according to claim 1, further comprising:
   at least one analog signal compatible single pole double throw complementary metal oxide semiconductor (CMOS) switch coupled to and controlled by the digital processor, wherein the at least one analog signal compatible single pole double throw CMOS switch comprises a third switching node coupled with a third external connection of said plurality of external connections, a fourth switching node coupled with a fourth external connection of said plurality of external connections, and a fifth switching node coupled with a fifth external connection of said plurality of external connections wherein the at least one analog signal compatible single pole double throw CMOS switch provides
   a low impedance between the third external input/output connection and the fourth external input/output connection and a high impedance between the third external input/output connection and the fifth external input/output connection when the digital processor asserts a control signal at a first logic level thereto, and a high impedance between the third external input/output connection and the fourth external input/output connection and a low impedance between the third external input/output connection and the fifth external input/output connection when the digital processor asserts a control signal at a second logic level thereto.

8. The integrated circuit device according to claim 7, wherein the first logic level is a logic level high and the second logic level is a logic level low.

9. The integrated circuit device according to claim 7, wherein the first logic level is a logic level low and the second logic level is a logic level high.

10. The integrated circuit device according to claim 7, wherein the at least one analog signal compatible single pole double throw CMOS switch is a plurality of analog signal compatible single pole double throw CMOS switches.

11. The integrated circuit device according to claim 7, wherein the single pole double throw CMOS switch comprises:
  a first P-channel metal oxide semiconductor (P-MOS) transistor having a source, gate and drain;
  a second P-channel metal oxide semiconductor (P-MOS) transistor having a source, gate and drain;
  a first N-channel metal oxide semiconductor (N-MOS) transistor having a source, gate and drain;
  a second N-channel metal oxide semiconductor (N-MOS) transistor having a source, gate and drain;
  a first inverter; and
  a second inverter;
    wherein:
      the drain of the first P-MOS transistor is coupled to the source of the first N-MOS transistor and the third switching node,
      the source of the first P-MOS transistor is coupled to the drain of the first N-MOS transistor and the fourth switching node,
      the gate of the first P-MOS transistor and an input of the first inverter are coupled to a digital control output of the digital processor,
      the gate of the first N-MOS transistor is coupled to an output of the first inverter,
      the drain of the second P-MOS transistor is coupled to the source of the second N-MOS transistor and the third switching node,
      the source of the second P-MOS transistor is coupled to the drain of the second N-MOS transistor and the fifth switching node,
      the gate of the second N-MOS transistor and an input of the second inverter are coupled to the digital control output of the digital processor, and
      the gate of the second P-MOS transistor is coupled to an output of the second inverter.

12. The integrated circuit device according to claim 7, wherein the digital processor is a microcontroller.

13. The integrated circuit device according to claim 7, further comprising an integrated circuit package enclosing the integrated circuit device.

14. The integrated circuit device according to claim 1, further comprising:
  at least one analog signal compatible single pole complementary metal oxide semiconductor (CMOS) switch coupled to and controlled by the digital processor, wherein the at least one analog signal compatible single pole CMOS switch comprises a third switching node coupled with a third external connection of said plurality of external connections, a fourth switching node coupled with a fourth external connection of said plurality of external connections, and a fifth switching node coupled with a fifth external connection of said plurality of external connections wherein the at least one analog signal compatible single pole CMOS switch has a high impedance between the third switching node and the fourth switching node and a low impedance between the third switching node and the fifth switching node when the digital processor asserts control signals at first logic levels thereto, a high impedance between the third switching node and the fourth switching node and a high impedance between the third switching node and the fifth switching node when the digital processor asserts control signals at second logic levels thereto, a low impedance between the third switching node and the fourth switching and a low impedance between the third switching node and the fifth switching node when the digital processor asserts control signals at third logic levels thereto, and a low impedance between the third switching node and the fourth switching node and a high impedance between the third switching node and the fourth switching node when the digital processor asserts control signals at fourth logic levels thereto.

15. The integrated circuit device according to claim 14, wherein the first logic levels are binary 00, the second logic levels are binary 01, the third logic levels are binary 10, and the fourth logic levels are binary 11.

16. The integrated circuit device according to claim 14, wherein the at least one analog signal compatible single pole CMOS switch is a plurality of analog signal compatible single pole CMOS switches.

17. The integrated circuit device according to claim 14, wherein the single pole CMOS switch comprises:
  a first P-channel metal oxide semiconductor (P-MOS) transistor having a source, gate and drain;
  a second P-channel metal oxide semiconductor (P-MOS) transistor having a source, gate and drain;
  a first N-channel metal oxide semiconductor (N-MOS) transistor having a source, gate and drain;
  a second N-channel metal oxide semiconductor (N-MOS) transistor having a source, gate and drain;
  a first inverter; and
  a second inverter;
  wherein:
    the drain of the first P-MOS transistor is coupled to the source of the first N-MOS transistor and the third switching node,
    the source of the first P-MOS transistor is coupled to the drain of the first N-MOS transistor and the fourth switching node,
    the gate of the first P-MOS transistor and an input of the first inverter are coupled to a first digital control output of the digital processor,
    the gate of the first N-MOS transistor is coupled to an output of the first inverter,
    the drain of the second P-MOS transistor is coupled to the source of the second N-MOS transistor and the third switching node,
    the source of the second P-MOS transistor is coupled to the drain of the second N-MOS transistor and the fifth switching node, the gate of the second N-MOS transistor and an input of the second inverter are coupled to a second digital control output of the digital processor, and the gate of the second P-MOS transistor is coupled to an output of the second inverter.

18. The integrated circuit device according to claim 14, further comprising an integrated circuit package enclosing the integrated circuit device.

* * * * *